United States Patent
Liang et al.

(10) Patent No.: US 6,879,015 B2
(45) Date of Patent: Apr. 12, 2005

(54) SEMICONDUCTOR DEVICE WITH ISOLATED INTERMETAL DIELECTRICS

(75) Inventors: Zhongning Liang, Nijmegen (NL); Erik Jan Lous, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/829,797

(22) Filed: Apr. 10, 2001

(65) Prior Publication Data

US 2001/0045669 A1 Nov. 29, 2001

(30) Foreign Application Priority Data

Apr. 12, 2000 (EP) .............................. 00201315

(51) Int. Cl.$^7$ ................................................ H01L 31/00
(52) U.S. Cl. ...................................................... 257/459
(58) Field of Search ................................ 257/459, 676, 257/786, 211

(56) References Cited

U.S. PATENT DOCUMENTS

| | | | | |
|---|---|---|---|---|
| 4,847,162 A | * | 7/1989 | Haluska et al. | 428/457 |
| 5,149,674 A | * | 9/1992 | Freeman et al. | 438/612 |
| 5,736,791 A | * | 4/1998 | Fujiki et al. | 257/781 |
| 5,739,587 A | * | 4/1998 | Sato | 257/758 |
| 5,917,197 A | * | 6/1999 | Alswede et al. | 257/48 |
| 5,923,088 A | * | 7/1999 | Shiue et al. | 257/758 |
| 5,976,953 A | * | 11/1999 | Zavracky et al. | 438/55 |
| 6,016,000 A | * | 1/2000 | Moslehi | 257/522 |
| 6,020,647 A | * | 2/2000 | Skala et al. | 257/784 |
| 6,022,791 A | * | 2/2000 | Cook et al. | 438/458 |
| 6,100,573 A | * | 8/2000 | Lu et al. | 257/508 |
| 6,100,589 A | * | 8/2000 | Tanaka | 257/758 |
| 6,143,396 A | * | 11/2000 | Saran et al. | 428/162 |
| 6,198,170 B1 | * | 3/2001 | Zhao | 257/784 |
| 6,232,662 B1 | * | 5/2001 | Saran | 257/750 |
| 6,297,563 B1 | * | 10/2001 | Yamaha | 257/781 |
| 6,313,540 B1 | * | 11/2001 | Kida et al. | 257/784 |
| 6,448,641 B1 | * | 9/2002 | Ker et al. | 257/700 |
| 6,465,337 B1 | * | 10/2002 | Lee et al. | 438/612 |
| 6,524,942 B1 | * | 2/2003 | Tsai et al. | 438/612 |
| 6,552,438 B1 | * | 4/2003 | Lee et al. | 257/784 |
| 6,633,087 B1 | * | 10/2003 | Ker et al. | 257/786 |
| 2001/0000928 A1 | * | 5/2001 | Lee et al. | 257/786 |
| 2002/0187634 A1 | * | 12/2002 | Saran et al. | 438/669 |

FOREIGN PATENT DOCUMENTS

EP 0875934 A2 * 11/1998 ............. H01L/3/48

OTHER PUBLICATIONS

Patent Abstracts of Japan, Tanaka Kazuo, "Semiconductor Device And Its Manufacture," Publication No. 10064945, Jun. 3, 1998, Application No. 08237310, Aug. 20, 1996.

* cited by examiner

*Primary Examiner*—Amir Zarabian
*Assistant Examiner*—Monica Lewis
(74) *Attorney, Agent, or Firm*—Peter Zawilski

(57) ABSTRACT

The invention relates to a semiconductor device comprising bond pad structure, which bond pad structure comprises a bond pad disposed above at least one layered stricture, but preferably a stack of layered structures, wherein the layered structure comprises a metal layer and a layer of a dielectric material. In the layer of dielectric material via lines are present and arranged in such a way that the metal layers and the via lines form isolated areas filled with the dielectric material.

10 Claims, 1 Drawing Sheet

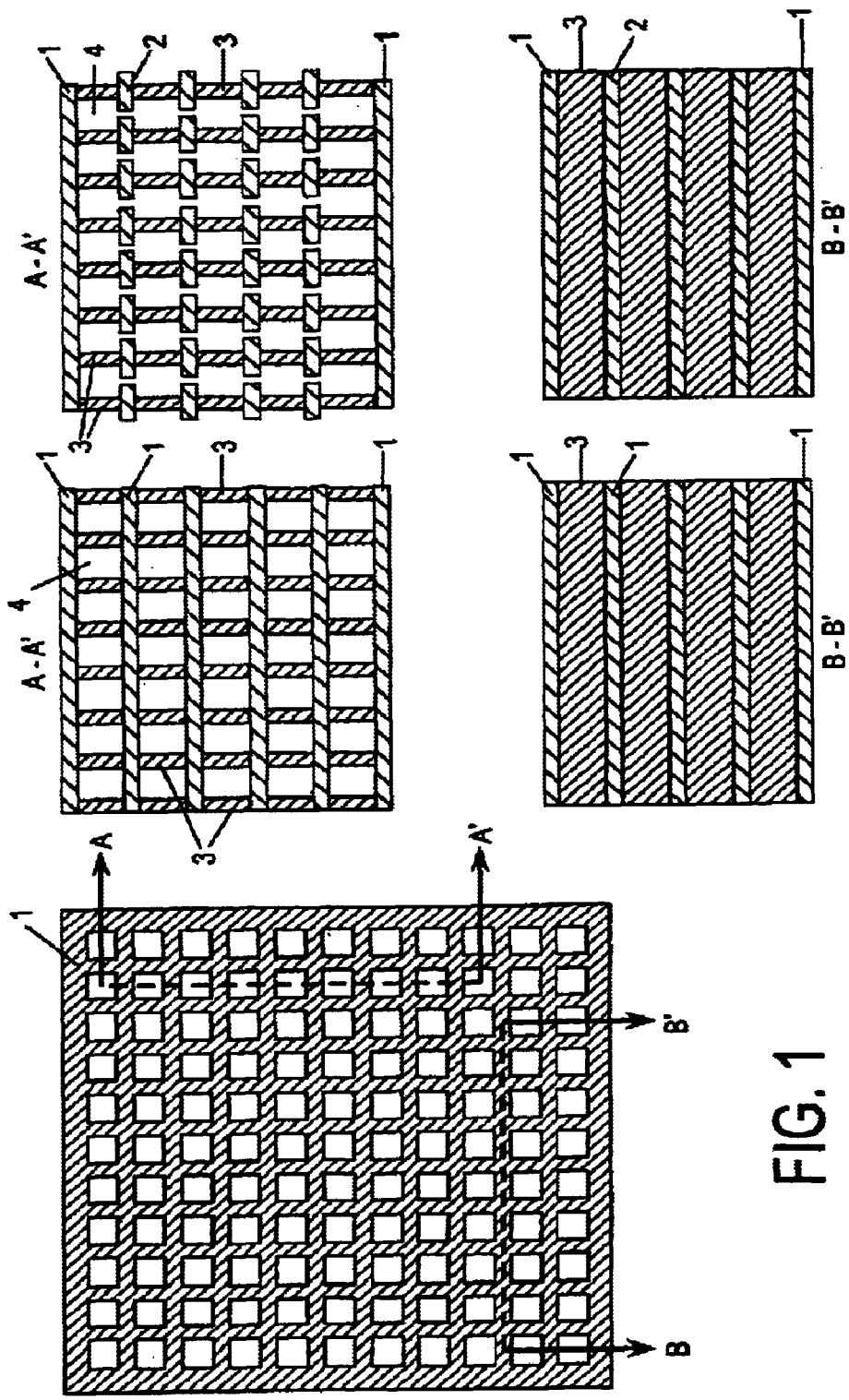

SEMICONDUCTOR DEVICE WITH ISOLATED INTERMETAL DIELECTRICS

FIELD OF THE INVENTION

The present invention relates to the field of semiconductor devices and more specifically to integrated circuits (ICs) having bond pads incorporated therein. More particularly, the invention relates to a semiconductor device comprising a new bond pad structure wherein cracking is eliminated, or at least reduced. More in detail, the present invention relates to a semiconductor device comprising a bond pad structure, which enables wire bonding and probing to be carried out without the induction of—or at least with a reduced occurrence of—cracks in the intermetal dielectrics applied.

BACKGROUND OF THE INVENTION

In state-of-the-art IC technology, bond pads consist of a multilayer aluminum metallization, generally with one or more layers of e.g. titanium or titanium nitride. Bond pads are present for attaching solder, wire or other bonding elements, especially constructed from aluminum, gold or copper.

Bond pads are typically disposed above one or more layers or stacks of brittle and/or soft intermetal dielectric materials, such as silicon oxides and organic materials.

Bond pad cracks can occur during ultrasonic wire bonding or even through probing. Cracks can lead to reliability problems, especially when low-k spin-on dielectrics, such as hydrogen silsesquioxane (HSQ), are used. Such dielectrics, and especially HSQ, are more brittle than other oxides, such as tetraethoxysilane-based oxides. In HSQ layers cracks can therefore more easily propagate than in other oxides. Similar problems occur with aerogels, organic polyimides, parylenes and the like, which all have low dielectric constants as compared to silicon oxides, but are structurally and mechanically weaker than these oxides.

In the art, there is a need for structures or methods to prevent or at least reduce the occurrence of bond pad cracking.

It has been proposed in EP-A-0 875 934 to dispose a patterned reinforcing structure in a dielectric layer disposed under the bond pad. The basic principle laid down in this document is that through the use of metal grids mechanical reinforcement of the dielectric stack can be achieved and damage due to bonding can be prevented. More in detail, this known reinforced structure is manufactured by forming a metal layer, patterning the metal layer in a predetermined area in accordance with a predetermined pattern having a plurality of vacant areas, forming a dielectric layer above the patterned metal layer, and filling the vacant areas in the patterned metal layer. Finally, a bond pad is formed on the dielectric layer above the patterned metal layer.

The known reinforcing structure may be a joined or interconnected grid or a crosshatch structure with a plurality of voids or vacant areas for containing and accommodating a large portion of weak dielectric material such as the said HSQ and the like. The grid structure is planar with a thickness below the thickness of the intermetal dielectric stack. In another embodiment, the reinforcing structure includes a repeating and non-interconnected pattern such as a crucifix pattern arranged in a regular manner. Other structures such as spirals have been described as well.

The present inventors have intensively studied two of the structures known from EP-A-0 875 934:

the crosshatch structure, wherein at each metal level, under the bond pad, a crosshatch grid of metal was inserted to confine mechanically relatively weak HSQ into square reservoirs created by the grid; and the crucifix structure. This structure provides a more open metal pattern as compared with the crosshatch structure, allowing HSQ to flow more easily into the voids.

In the crosshatch structure, the metal line widths and spacings were designed to confine much of the HSQ into the reservoirs while minimizing the area of each reservoir, so that the HSQ layer is spared the direct mechanical impact of bonding. Vias were formed only at the pad periphery.

In the crucifix structure, the more open pattern allows the HSQ to flow more easily in the voids present in the structure. By virtue thereof, the amount of HSQ remaining over the metal lines is reduced slightly further as compared to the crosshatch structure.

Both known structures have, however, a continuous TEOS dielectric layer between the metal layers, which dielectric layer can be cracked due to bonding or probing.

SUMMARY OF THE INVENTION

The present invention aims to solve or at least reduce this problem. In accordance with the present invention, it has DOW been found that elimination, or at least reduction of bond pad cracking can be achieved by isolating the intermetal dielectrics with metal lines and via lines. Further, the bond pad structure of the semiconductor device according to the present invention prevents the propagation of any cracks that are formed. Moreover, metal peel off during bonding is diminished. Metal peel off is a failure mode occurring at the interface between a top metal plate and intermetal dielectrics.

More in detail, the present invention is based on the principle that use is made of via lines together with metal lines to completely isolate intermetal dielectrics. For this purpose, the invention relates to a semiconductor device comprising a bond pad structure, which bond pad structure comprises a bond pad disposed above at least one layered structure, but preferably a stack of layered structures, wherein the layered structure comprises a metal layer and a layer of a dielectric material, characterized in that via lines are present in the layer of dielectric material, which via lines are arranged in such a way that the metal layers and the via lines form isolated areas filled with the dielectric material.

Furthermore, the present invention relates to a method of manufacturing a semiconductor device as described above, which method comprises the steps of:

(f) forming a metal layer;

(g) forming a dielectric layer;

(h) patterning via lines or via grids in the dielectric layer, (i) filling the patterned via lines or via grids with a conductive material, such as a metal, and preferably tungsten or copper; and (j) applying a metal bond pad on top of the dielectric layer and the filled via lines or via grids.

By the use of via lines connected to the metal layer, the adhesion between the top metal plate and the underlying layers is enhanced, so that metal peal off occurs no longer or less often.

Without being bound by a very specific theory, it is assumed that when a crack is formed in an intermetal dielectric, the system releases elastic energy and gains surface energy. Based on thermodynamic principles, the crack should not form when the amount of elastic energy to be released is smaller than the amount of surface energy to be gained. Since elastic energy is proportional to the volume of the dielectric and surface energy is proportional to the surface area of the dielectric, the present invention makes use of a small volume-to-area ratio by using small feature sizes. Therefore, the via lines, or optionally the via grids, are advantageously arranged in such a way that the volume-to-surface area is—dependent on the dielectric material used—adjusted such that the amount of elastic energy to be released when a crack is formed is smaller than the amount of surface energy to be gained when said crack is formed.

Apart from the above, it is noted that in the art vias are normally patterned in square or round pillars. Multiple rows of such pillars, shifted with respect to each other, are in use in e.g. seal rings to prevent the propagation of cracks. However, in accordance with the present invention, via lines, e.g. in the form of a via grid, avoid the formation of cracks as well as the propagation in case a crack is formed anyway. Moreover, bonding stress can be released by ductile properties of the via-metal, in particular when tungsten is used as the via-metal.

BRIEF DESCRIPTION OF THE DRAWING

The present invention will be described in further detail with reference to the drawings, wherein FIG. 1 is a schematic top view of the bond pad structure of the semiconductor device according to the invention;

FIGS. 2 and 3 are cross-sections of two embodiments of the bond pad structure of the semi conductor device of the present invention, wherein the upper cross-section A-A' of FIGS. 2 and 3 are cross-sections of FIG. 1 indicated by cross-section view A-A', while the lower cross-sections B-B' of FIGS. 2 and 3 are cross-sections of FIG. 1 indicated by cross-section view B-B'.

DETAILED DESCRIPTION OF THE PRIMARY EMBODIMENT

FIG. 1 shows a schematic top view of the bond pad structure of the semiconductor device of the present invention at via level. This top view shows the crosshatch feature of the structures. Intermetal dielectrics are isolated by metal and via lines. The details will become clear from FIGS. 2 and 3.

In FIG. 2, an embodiment is shown wherein each layered structure comprises a metal plate 1. Intermetal dielectrics 4 are isolated by two adjacent metal plates 1 and, in the vertical direction, by via lines or via grids 3, FIG. 3 shows the embodiment wherein the top and bottom layered structures comprise a metal plate 1, while the intermediate layered structures are formed by metal lines or metal grids 2. Intermetal dielectrics 4 are isolated by the top and bottom metal plates 1 and by the metal lines or metal grids 2 and via lines or via grids 3 in between.

The distances between the via lines or via grids in a particular layer structure are chosen to be such that the volume-to-surface area ratio of the dielectrics 4 in the direction parallel to the bond pad is sufficiently small to prevent crack formation during probing or bonding. For example, when the dielectrics thickness is 1 $\mu$m, the width and length of the dielectric block should be smaller than 10 $\mu$m. Normally, a bond pad size is about 80×80 $\mu$m. Without the isolation of the dielectric layers cracks can easily form.

On top of the structures in accordance with the invention a bond pad, preferably of Al, is applied.

What is claimed is:

1. A semiconductor device comprising a bond pad structure, which bond pad structure comprises a bond pad disposed above a layered structure that increases structural integrity of the bond pad structure, wherein the layered structure comprises a top and bottom metal layer, a plurality of intermediate metal layers, at least one layer of dielectric material, and a plurality of equally spaced parallel via lines that connect the top and bottom metal layers and partition the at least one dielectric area to form isolated areas filled with dielectric material, and wherein the isolated areas filled with dielectric material have a surface to volume ratio such that an amount of elastic energy to be released when a crack is formed in the dielectric material is smaller than an amount of surface energy to be gained when the crack is formed.

2. A semiconductor device as claimed in claim 1, wherein the via lines are lines of tungsten.

3. A semiconductor device as claimed in claim 1, wherein a stack of layered structures is present.

4. A semiconductor device as claimed in claim 3, wherein the metal layer in each layered structure is a metal plate.

5. A semiconductor device as claimed in claim 4, wherein the top and bottom metal layers of the stack are metal plates, and the intermediate metal layer or layers are parallel metal lines.

6. A semiconductor device as claimed in claim 5, wherein the metal lines are patterned in the form of a grid.

7. A semiconductor device as claimed in claim 1, wherein the via lines are patterned in the form of a grid.

8. The semiconductor device of claim 1 wherein the dielectric material comprises hydrogen silsesquioxane.

9. The semiconductor device of claim 1 wherein the isolated areas of dielectric material have dimensions that are less than that of the bonding pad.

10. The semiconductor device of claim 1 wherein the isolated areas of dielectric material have dimensions that are chosen in dependence upon the composition of the dielectric material.

* * * * *